United States Patent [19]
Horl

[11] Patent Number: 5,550,507
[45] Date of Patent: Aug. 27, 1996

[54] DEMODULATOR EMPLOYING CYCLIC SWITCHING OF THE GAIN FACTOR OF AN OPERATIONAL AMPLIFIER BETWEEN DIFFERENT PREDETERMINED VALUES

[75] Inventor: Manfred Horl, Hamburg, Germany

[73] Assignee: U.S. Philips Corporation, New York, N.Y.

[21] Appl. No.: 547,391

[22] Filed: Oct. 24, 1995

Related U.S. Application Data

[63] Continuation of Ser. No. 317,158, Oct. 3, 1995, abandoned.

[51] Int. Cl.⁶ .............................. H03D 1/00; H03D 1/04; H03D 1/18
[52] U.S. Cl. ........................ 329/361; 329/362; 455/337
[58] Field of Search ............................ 329/361, 362, 329/358; 455/337

[56] References Cited

U.S. PATENT DOCUMENTS

| | | | |
|---|---|---|---|
| 3,631,355 | 12/1971 | Vail | 329/362 |
| 3,879,670 | 4/1975 | Fox | 329/361 |
| 3,891,937 | 6/1975 | Bockelmann et al. | 330/29 |
| 4,031,479 | 6/1977 | Thomas, Jr. et al. | 329/361 |
| 4,139,738 | 2/1979 | Ienaka et al. | 329/361 X |
| 5,015,963 | 5/1991 | Sutton | 329/361 |

FOREIGN PATENT DOCUMENTS

| | | | |
|---|---|---|---|
| 2361770 | 3/1978 | France | 329/361 |
| 2262580 | 7/1974 | Germany . | |
| 4214612 | 11/1993 | Germany . | |
| 0209244 | 12/1983 | Japan | 329/361 |
| 2091054 | 7/1992 | United Kingdom . | |

*Primary Examiner*—David Mis
*Attorney, Agent, or Firm*—Leroy Eason

[57] ABSTRACT

An AM demodulator circuit arrangement includes an operational amplifier having at least two alternate input networks and at least two alternate feedback networks which can be selectively activated by switching signals so as to establish an amplifier gain factor having at least two different predetermined values. The switching signals are derived from a square wave clock control signal of a frequency which is an integral multiple of the carrier frequency of the AM input signal supplied to the demodulator. As a result of the periodic variation of the amplifier gain factor, the demodulated signal is produced at the output of the amplifier. Such a demodulator avoids offsets or interference frequencies due to manufacturing tolerances. Sensitivity to interference at higher harmonics of the carrier frequency can be suppressed by appropriate selection of the waveform of the gain factor variation, which is determined by the waveform of the switching signal.

7 Claims, 9 Drawing Sheets

FIG. 6a
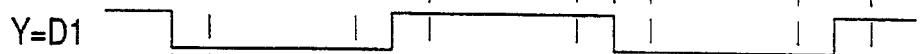
FIG. 6b
FIG. 6c
FIG. 6d
FIG. 6e
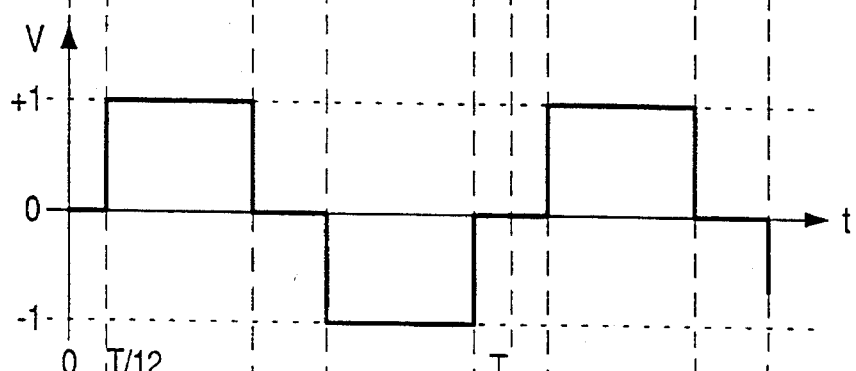
FIG. 6f
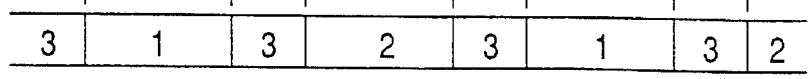
FIG. 6g

FIG. 8a (40)
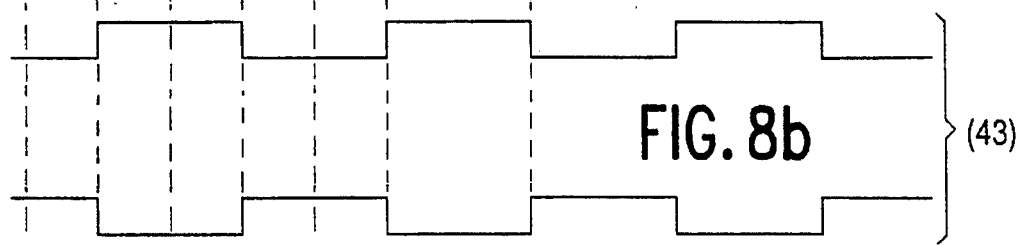
FIG. 8b  (43)
FIG. 8c
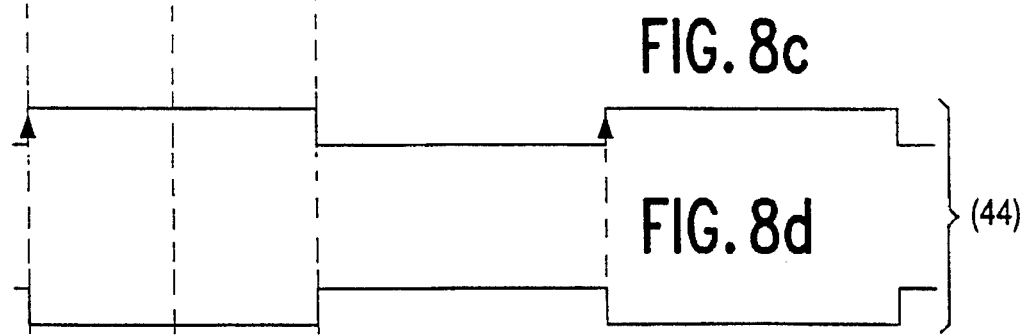
FIG. 8d  (44)
FIG. 8e
(41)
FIG. 8f
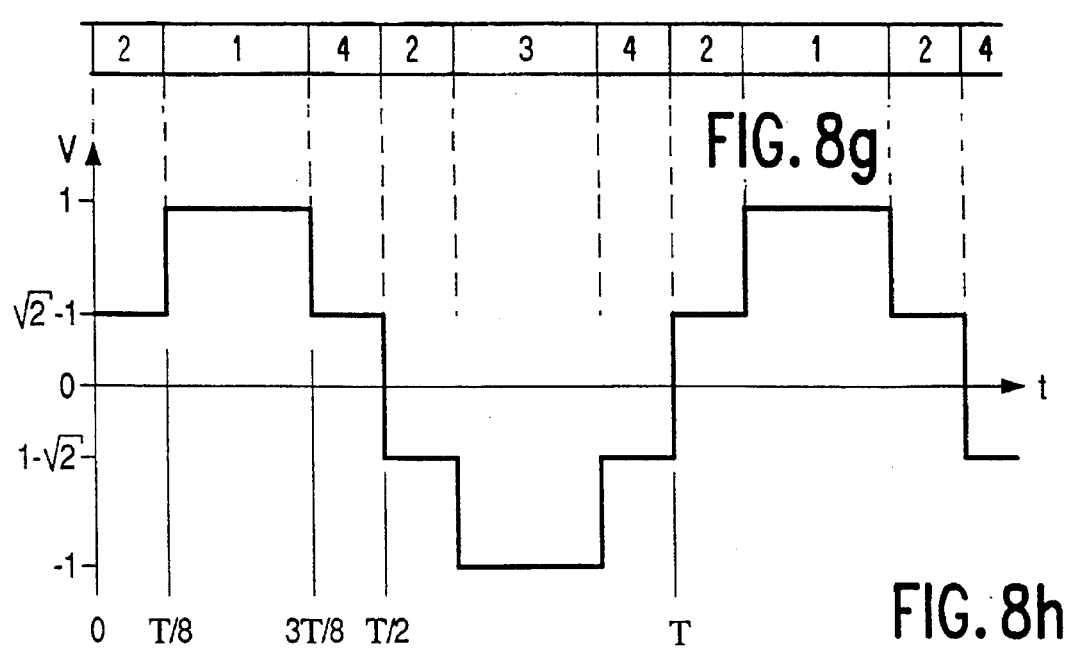
FIG. 8g
FIG. 8h

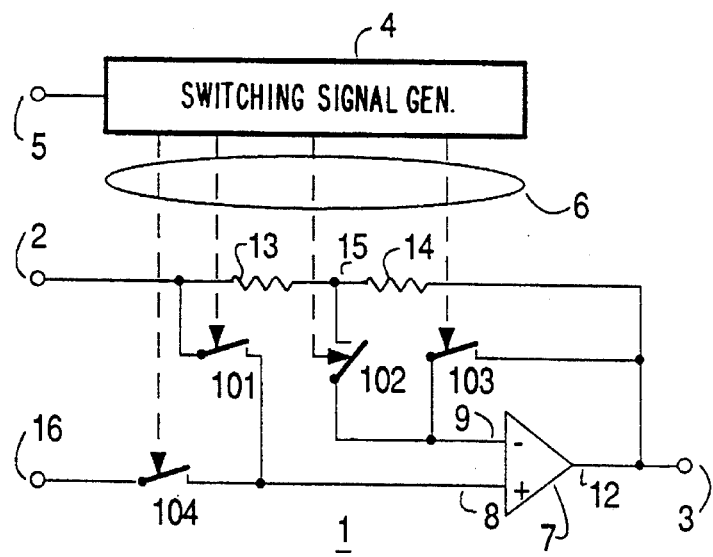
FIG. 10
|  | 101 | 102 | 103 | 104 |
|---|---|---|---|---|
| V = +1 | 1 | 0 | 1 | 0 |
| V = -1 | 0 | 1 | 0 | 1 |
FIG. 11
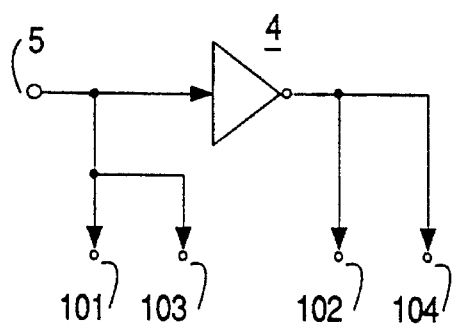
FIG. 12
|  | 101 | 102 | 103 | 104 |
|---|---|---|---|---|
| V = +1 | 1 | 0 | 1 | 0 |
| V = -1 | 0 | 1 | 0 | 1 |
| V = 0 | 0 | 0 | 1 | 1 |
FIG. 13

| | | 201 | 202 | 203 | 204 | 205 | 206 |
|---|---|---|---|---|---|---|---|
| 1. | V = +1 | 1 | 0 | 0 | 0 | 1 | 0 |
| 2. | V = -1 | 0 | 0 | 1 | 0 | 0 | 1 |
| 3. | V = √2 -1 | 0 | 1 | 0 | 0 | 1 | 0 |
| 4. | V = 1- √2 | 0 | 0 | 0 | 1 | 0 | 1 |

DEMODULATOR EMPLOYING CYCLIC SWITCHING OF THE GAIN FACTOR OF AN OPERATIONAL AMPLIFIER BETWEEN DIFFERENT PREDETERMINED VALUES

This is a continuation of application Ser. No. 08/317,158, filed Oct. 3, 1995, now abandoned.

BACKGROUND OF THE INVENTION

The invention relates to a circuit arrangement for demodulating an information signal which is amplitude-modulated on a carrier wave.

A circuit arrangement having two cross-coupled transistor differential amplifiers, i.e. four transistors, is known from DE-OS 22 62 580. Therein each transistor has an electrode in common with each of the three other transistors. For example, a first transistor has the emitter terminal in common with a second transistor, the collector terminal in common with a third transistor and the base terminal in common with a fourth transistor. The interconnected collector terminals of the first and the third transistor are connected to a positive operating voltage via a first resistor from which the output voltage is derived. The interconnected collector terminals of the second and the fourth transistor are also connected to the operating voltage via a second resistor. The interconnected emitters of the first two transistors are connected to the collector terminal of a fifth transistor whose emitter terminal is connected to ground via a third resistor and to whose base terminal a positive direct voltage is applied, for which reason the fifth transistor is also referred to as DC transistor. In the same way a sixth transistor with a fourth resistor is arranged as an emitter resistor in the common emitter lead of the third and the fourth transistor, which emitter resistor has the same resistance as the third resistor. The sum of a signal voltage and a direct voltage is applied to the base terminal of this sixth transistor, while the last-mentioned direct voltage is equally large as the direct voltage at the base terminal of the fifth transistor. The sixth transistor is therefore also referred to as signal transistor. By means of the direct control voltage applied between the base terminals of the first and the fourth transistor on the one hand and the second and the third transistor on the other hand, it is possible to control the amplification of the signal applied to the base terminal of the sixth transistor.

Such a circuit arrangement may also be used for demodulating an information signal which is amplitude-modulated on a carrier wave, the modulated signal being applied to the base terminal of the sixth transistor or between the base terminals of the fifth and the sixth transistor. The two cross-coupled transistor differential amplifiers are controlled by means of the carrier wave or a square-wave at the frequency of the carrier wave as a "control direct voltage".

This circuit arrangement has the drawback that manufacturing tolerances in the manufacture of the resistors and transistors used, particularly also when manufactured as an integrated circuit on a semiconductor body, viz. deviations of the relative resistances and the transistor parameters, lead to a DC offset of the cross-coupled transistor differential amplifiers which may cause interference frequencies at the output. These errors lead to an unwanted distortion of the useful signal to be processed.

SUMMARY OF THE INVENTION

It is an object of the invention to provide a circuit arrangement for demodulating a signal which is free from such interferences.

According to the invention, this object is solved by using an amplifier circuit arrangement for demodulating a modulated wave which includes an information signal, which is amplitude-modulated on a carrier wave. The amplifier arrangement comprises an operational amplifier which has at least two input stages which can be selectively activated by means of switching signals, and/or are connected to at least two switchable input, output and feedback networks which can be selectively activated by the switching signals as a result of such switching the amplifier arrangement has at least two different gains, the value of which are differently predeterminable by the selective activation of the individual input stages and feedback, respectively. The operational amplifier further has an output stage as well as a switching signal generating stage for generating the switching signals from a control signal of a frequency which is an, integral multiple of the carrier frequency.

In the circuit arrangement according to the invention the switching to different gains is effected in accordance with a time function whose fundamental frequency is the same as the carrier frequency. For providing an output signal, the amplitude modulated information signal is multiplied by a time-dependent gain at a frequency at which the demodulated information signal (in the baseband) is obtained. Preferably, a square-wave oscillation is applied as a control signal to the switching signal generating stage. Switching of the input stages or networks can be directly realised in a simple way by means of this control signal, or switching signals having a different time variation may be derived from this wave in a simple manner.

This is particularly advantageous if, in accordance with a further embodiment of the invention, the different gains are predeterminable in a time sequence which constitutes a periodical, step-shaped and zero-symmetrical function of time whose fundamental frequency corresponds to the frequency of the carrier wave. The frequency of the control wave is preferably chosen in conformity with the steps of this function.

The invention has the further advantage that an amplifier arrangement using an operational amplifier has a wide control range, so that substantially the entire power supply voltage of the amplifier arrangement can be utilized for signal control, particularly for the amplitude of the demodulated useful signal.

In this respect it is to be noted that a circuit arrangement for providing stepped attenuation of an electric signal is known from DE-PS 32 00 071, which can be used for volume or tone control in audio amplifiers. This circuit arrangement comprises a switching amplifier which consists of a plurality of pairs of differential transistor amplifiers. The base electrodes of the first transistors of the differential pairs are individually connected to an input, while the emitter electrodes of these transistors are individually connected to the emitter electrodes of the other transistor of the pair and their collector electrodes are jointly connected via a collector load to a positive power supply terminal. The base electrodes of the other transistors of the pairs are jointly connected to the inverting input and their collector electrodes are jointly connected via a collector load to the positive power supply terminal. The collector signals which are present at the collector loads are amplified via a differential amplifier and an output amplifier and fed back from the output to the inverting input.

To be able to selectively activate each input of such known switching amplifier, the emitter electrodes of the transistor pairs are connected to emitter current sources via associated separating transistors whose base electrodes are connected to a reference voltage source and via associated switching transistors whose base electrodes are each connected to associated control inputs, which emitter current sources may be constituted by resistors so that an emitter current determined by the reference voltage and the value of the relevant resistor starts flowing when the relevant switching transistor is turned on, with the result that the corresponding input is activated and the signal present at this input appears at the output.

In accordance with a further embodiment of the invention the time sequence of the different gains and their values are predetermined in such a way that the function of time constituted thereby possibly comprises small harmonics of its fundamental frequency in addition to the fundamental frequency.

In its most general concept, the periodical, step-shaped function of time in accordance with which the gains of the amplifier arrangement vary has a frequency spectrum with the frequency of the carrier oscillation as a fundamental frequency as well as with their harmonics. If the signal to be demodulated is multiplicatively combined with such a function, interference components in the frequency band of the (demodulated) information signals are produced when the applied amplitude-modulated information signal comprises components at corresponding multiples of the frequency of the carrier wave. During operation of such a circuit arrangement this becomes manifest as sensitivity to signal frequencies which are in the vicinity of the frequencies of said harmonics. Since such interferences cannot be eliminated or can hardly be eliminated from the demodulated useful signal, it is very important to avoid such interferences right from the start.

The afore-mentioned implementation of the invention renders it possible to avoid or suppress such interferences in a very simple and effective manner, in that the time sequence and the absolute values of the different gains within the periodical, step-shaped and zero-symmetrical function of time are chosen so that the harmonics of this function become minimal at multiples of the carrier wave frequency. Basically, this minimization can be realised by an arbitrarily fine stepping and thus by an arbitrary increase of the number of input stages or networks, but in practice this is limited due to the attendant large number of components and the manufacturing tolerances of these components. Most important is a suppression of the influences of the lower harmonics, particularly at three or five times the frequency of the carrier oscillation. In this case a satisfactory interference suppression is achievable with a small number of components.

In a first further embodiment of the invention, with which these interference influences can be suppressed, a circuit arrangement according to the invention comprising an operational amplifier having an input stage which is connected to at least two switchable input, output and feedback networks, is implemented in such a way that the input stage has two differential input terminals, the networks are jointly constituted by a first resistive voltage divider between an input of the amplifier arrangement and a reference voltage terminal, a second resistive voltage divider is between the input of the amplifier arrangement and an output of the amplifier arrangement, and the two resistive voltage dividers have taps which are controlled by the switching signals and can be optionally connected to either of the differential input terminals in accordance with the desired gain.

In this circuit arrangement the amplifier arrangement can be adjusted to different gains by the different connection of the taps of the voltage dividers to the differential input terminals. The desired time variations of the gains can be obtained in a simple manner by means of a corresponding time sequence of realising these different connection possibilities.

In a further embodiment of the invention this advantage may also be achieved by means of a circuit arrangement in which the operational amplifier comprises at least two input stages which can be selectively activated by means of the switching signals. Each of the input stages has two differential input terminals and is connected to an input, output or feedback network for these stages, the networks being jointly constituted by a first resistive voltage divider which is arranged between an input of the amplifier arrangement and a reference voltage terminal, and a second resistive voltage divider which is arranged between the input of the amplifier arrangement and an output of the amplifier arrangement. The two resistive voltages dividers have taps, each of which is connected to at least one of the differential input terminals.

The input stages in the circuit arrangement according to the invention are preferably implemented as differential amplifier stages, each having a non-inverting input which constitutes a first differential input terminal and an inverting input which constitutes the second differential input terminal. Preferably, the non-inverting inputs are connected to the taps of the first resistive voltage divider and the inverting inputs are connected to the taps of the second resistive voltage divider if there is a plurality of input stages, or they can be connected to the single input stage. This provides a circuit arrangement which can be easily extended and adapted for further purposes of application. Moreover, in individual cases, the inverting and non-inverting inputs may alternatively be connected to the taps of the respective resistive voltage divider.

In an advantageous embodiment of the circuit arrangement according to the invention, using three differently predeterminable gains, the switching signal generating stage comprises a (first) frequency divider dividing by six to which a square-wave oscillation at six times the frequency of the carrier oscillation can be applied as a control signal from which it can generate a plurality of square-waves at the carrier frequency, which waves are phase-shifted with respect to each other by one sixth of the carrier period of the carrier oscillation, and a (first) combining circuit in which the switching signals can be generated by logic combinations of these square-wave oscillations and the control oscillation. Such a (first) frequency divider is described in German Patent Application P 42 14 612.7, FIGS. 7 and 8 and their description. By means of simple logic combinations the switching signals can be derived particularly for a gain as a function of time with the square-wave oscillations available at this (first) frequency divider, while the third harmonic content is very low.

In a further embodiment of the circuit arrangement according to the invention, using four differently predeterminable gains, the switching signal generating stage comprises a (second) frequency divider having two cascaded divider stages by which the frequency of an oscillation applied thereto can be halved and which can supply two output signals at this halved frequency and at a phase-shift of one fourth of the period of this halved frequency. The switching signals can be generated in a (second) combining circuit by logic combinations of selected output signals of the divider stages.

In a very advantageous way, this embodiment combines a low number of circuit components with a high suppression of interference, because not only the third but also the fifth harmonic is minimized in this case. Simultaneously, the number of components for frequency division and the logic combinations is very low.

These and other aspects of the invention will be apparent from and elucidated with reference to the embodiments described hereinafter.

BRIEF DESCRIPTION OF THE DRAWINGS

In the drawings

FIGS. 6a–6g shows some signal variations in the circuit arrangement of FIG. 5, FIG. 7 shows a third embodiment of the invention with an operational amplifier having four input stages and FIGS. 8a–8h shows the variations with respect to time of some signals in the circuit arrangement of FIG. 7, FIG. 10 shows a fourth embodiment of the circuit arrangement according to the invention, with an operational amplifier having an input stage and a switchable input, output and feedback network, FIG. 11 shows a Table to explain the function of the circuit arrangement of FIG. 10, FIG. 12 shows an embodiment of a switching signal generating stage for use in the embodiment of FIG. 10, FIG. 13 shows a second Table to explain a modification of the mode of functioning of the circuit arrangement of FIG. 10.

DETAILED DESCRIPTION OF THE PREFERRED EMBODIMENTS

Figure 1:
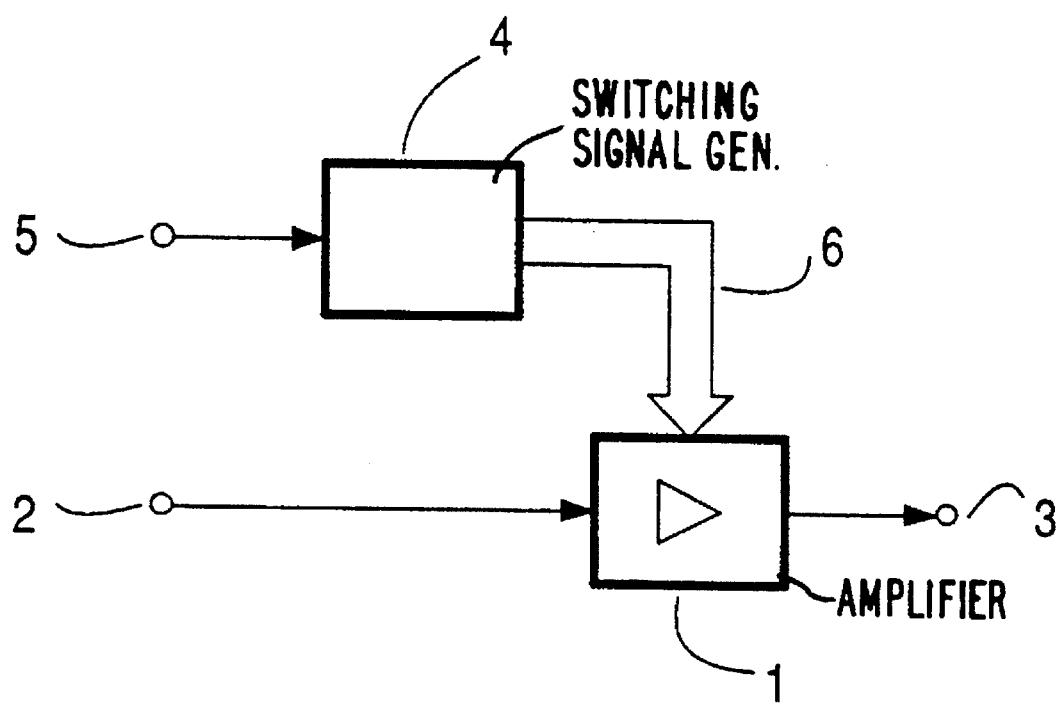
FIG. 1 is a block-schematic diagram of a circuit arrangement according to the invention.

In the circuit diagram of FIG. 1 the amplifier arrangement 1 which has an input 2 to which an information signal which is amplitude-modulated on a carrier wave can be applied. The demodulated information signal is produced at output 3 of the amplifier arrangement 1. The circuit arrangement further comprises a switching signal generating stage 4 having an input 5 for a control signal whose frequency constitutes a predeterminable integral multiple of the carrier frequency. A square-wave is preferably used as the control signal. In the switching signal generating stage 4 a switching signal is generated from the control signal and is applied via a switching signal lead 6 to the amplifier arrangement 1. All switching signals are formed in such a way that they can vary the gain of the amplifier arrangement 1 in accordance with a periodical and preferably step-shaped zero-symmetrical function of time. The amplitude-modulated information signal at the input 2 is multiplied by this function of time, so that a demodulated information signal is made available at the output 3.

Figure 2:
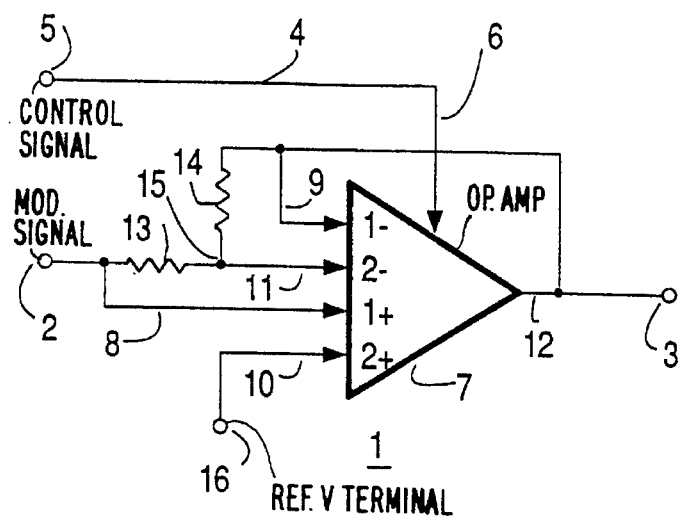
FIG. 2 shows a first embodiment of the invention with an operational amplifier having two input stages.

In accordance with the embodiment of FIG. 2, in which elements already described have the same reference numerals, the amplifier arrangement 1 comprises an operational amplifier 7 having two input stages which are actively switchable in an optional manner via the switching signal lead 6. In FIG. 2 the switching signal generating stage 4 and the switching signal lead 6 are shown in a very simple way, viz. as a continuous connection and it has been assumed that the control signal at the input 5 may assume two levels in accordance with its time variation as a square-wave oscillation, the first input stage being actively switchable by the one level and the second input stage being actively switchable by the other level. In a modification of this embodiment the switching signal generating stage 4 may comprise an inverter circuit if both input stages can be switched to their active state by the same first level and to their inactive state by the same second level.

Each of the two input stages (not explicitly shown) of the operational amplifier 7 has two differential input terminals and is preferably constituted as a differential amplifier stage so that the differential input terminals pair-wise constitute a non-inverting and an inverting input. In FIG. 2 they are provided with a minus sign and a plus sign and with continuous numerals, in conformity with the enumeration of the input stages. Accordingly, the non-inverting input 8 of the first input stage of the operational amplifier 7 is denoted "1+" and the associated inverting input 9 is denoted "1–", the non-inverting input 10 of the second input stage is denoted by "2+" and the associated inverting input 11 is denoted by "2–". The corresponding designations are also used in the further Figures.

The operational amplifier 7 also has an output 12 which constitutes the output 3 of the amplifier arrangement 1 in the embodiment of FIG. 2. Moreover, the operational amplifier 7 is connected to the switching signal lead 6 via which a switch can be made in the above-described manner between the effective operation of the first and the second input stage.

A (second) resistive voltage divider comprising two resistors 13, 14 is arranged between the input 2 of the amplifier arrangement 1 and its output 3, which resistors enclose a tap 15 between them. The input 2 is connected to the non-inverting input 8 of the first input stage, the tap 15 is connected to the inverting input 11 of the second input stage and the output 3 is connected to the inverting input 9 of the first input stage, while the non-inverting input 10 of the second input stage is connected to a reference voltage terminal 16 via which a reference direct voltage is supplied. A resistor which is basically usable between the input 2 and the reference voltage terminal 16 via which the input resistance of the amplifier arrangement 1 as well as an input direct bias voltage of the input 2 can be adjusted is not required for explaining the principal function of the circuit arrangement of FIG. 2 and therefore it is not shown. In other embodiments such a resistor may constitute a (first) resistive voltage divider whose taps can be connected to inputs of the input stages, preferably the non-inverting inputs.

Figure 3A:
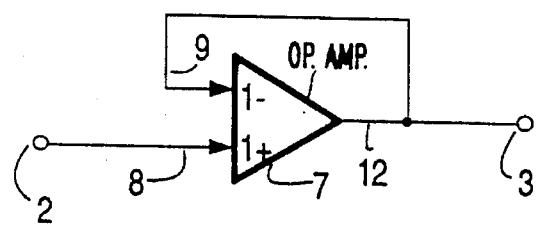
FIGS. 3a and 3b shows two circuit diagrams for the mode of functioning of the circuit arrangement of FIG. 2
Figure 3B:
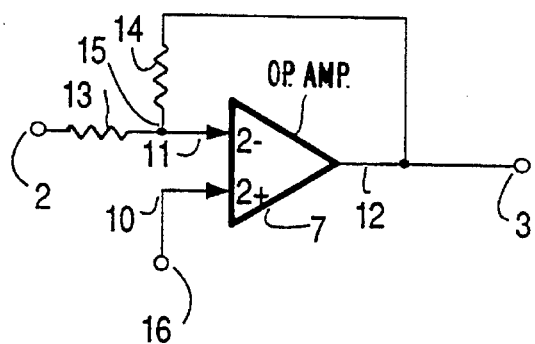

For the purpose of explaining the mode of functioning of FIG. 2, the two circuit configurations are shown in FIG. 3, which configurations result from switching to either the first or the second input stage. In FIG. 3a the first input stage is active and in FIG. 3b the second input stage is active. In FIG. 3a the resistors 13 and 14 are not shown for the sake of clarity because they only constitute a connection, parallel to the operational amplifier 7, between the input 2 and the output 3 of the amplifier arrangement 1.

When the first input stage of the operational amplifier 7 is active, it constitutes a transmission path in accordance with FIG. 3a with a gain of 1, whereas there is a gain of −1 when the second input stage is active in accordance with FIG. 3b. If a square-wave having the frequency of the carrier is applied as a control signal to the input 5, the gain of the operational amplifier 7 is switched at the carrier frequency between the values +1 and −1. Each half wave of the amplitude-modulated useful signal is thus transmitted with a different gain factor. Particularly if each positive half cycle of the carrier wave is transmitted at the gain 1, each negative half cycle of the carrier wave is transmitted at the gain −1 and a rectified signal is obtained from which the useful signal can immediately be obtained by separating the low-frequency signal components.

Figure 4:
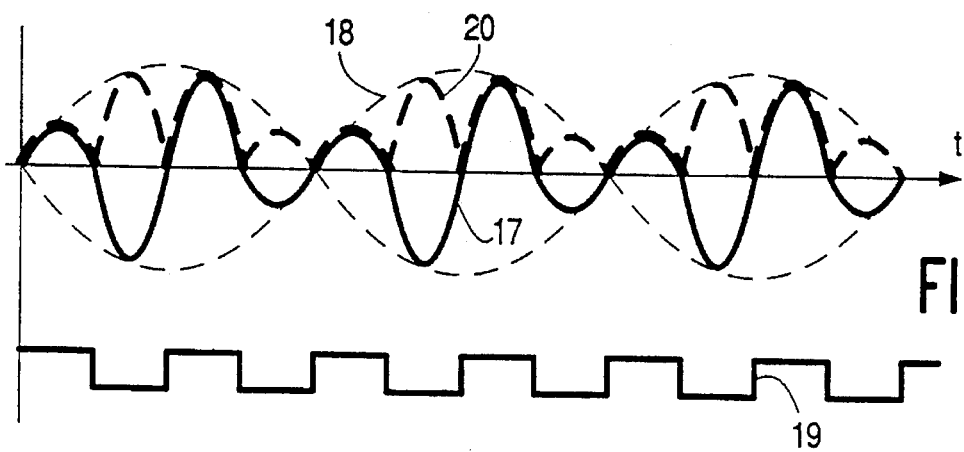
FIG. 4 shows diagrammatically some variations with respect to time of signals in the circuit arrangement of FIG. 2.

These situations are diagrammatically explained with reference to FIG. 4. In this Figure the upper part shows the carrier wave 17 modulated with the useful signal as a solid line whose amplitude in accordance with the useful signal 18 shown as a broken line varies with time t. The lower part of FIG. 4 shows the time variation of the square wave 19 whose frequency corresponds to that of the carrier wave. The broken line further denotes the carrier wave 20 multiplied by the time variable gain, which results in a rectified signal. By low-pass filtering the envelope thereof, the useful signal 18 is separated therefrom.

Figure 5:
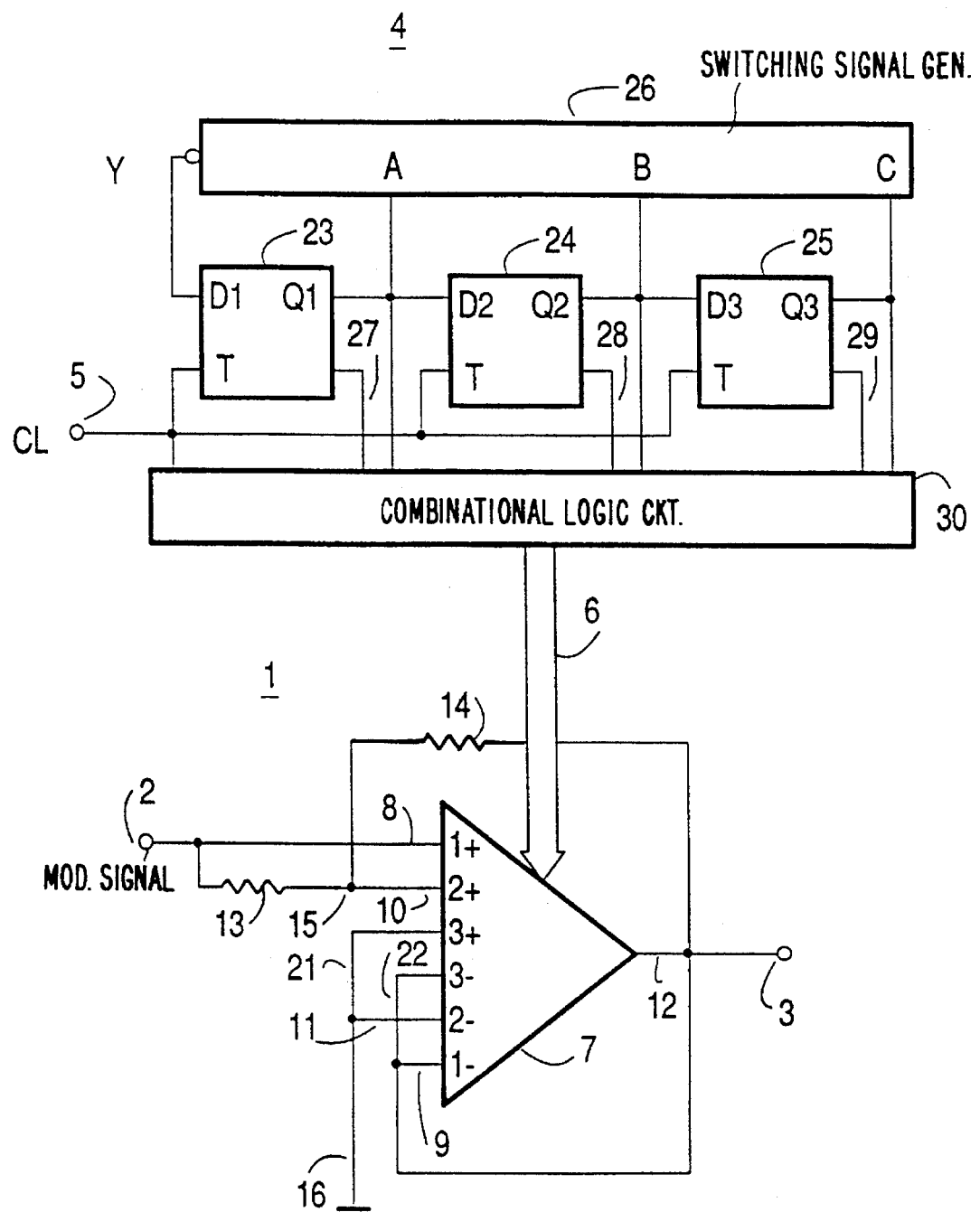
FIG. 5 shows a second embodiment of the invention with an operational amplifier having three input stages in a block-schematic diagram.

According to the invention a time variation of the gain having a possibly low number of harmonics is constituted so as to decrease the sensitivity of the circuit arrangement to frequencies in the useful signal which is amplitude-modulated on the carrier wave and applied to the input 2, which sensitivity is due to the multiplication by the square-wave time variation of the gain. Particularly, the lower harmonics are minimized in value. FIG. 5 shows an example of the circuit arrangement according to the invention with which the sensitivity can be minimized to the third harmonic of the carrier oscillation. Since this harmonic has the highest coefficient for a series development of the square-wave variation of the gain with respect to time, a suppression of the sensitivity of the circuit arrangement at this third harmonic is very advantageous.

In the circuit arrangement of FIG. 5 the operational amplifier 7 also has a third input stage in addition to the two input stages known from FIGS. 2 and 3, which third input stage has a non-inverting input 21 and an inverting input 22 which are denoted by "3+" and "3−", respectively in conformity with the inputs of the first two input stages. Otherwise, the amplifier arrangement 1 widely corresponds to the configuration of FIG. 2, but the tap 15 is connected to the non-inverting input 10 of the second input stage (2+) and consequently the inverting input 11 of the second input stage (2−) is connected to the reference voltage terminal which is constituted by ground in the present case. The non-inverting input 21 of the third input stage (3+) is also connected to the reference voltage terminal 16, whereas the inverting input 22 of the third input stage (3−) is connected to the output 12 of the operational amplifier 7, jointly with the inverting input 9 of the first input stage (1−).

If in the arrangement of FIG. 5 the first two input stages are switched actively, the gains described with reference to FIGS. 2 to 4 are obtained for the amplifier arrangement 1, i.e. they assume the value +1 upon operation with the first input stage and the value −1 upon operation with the second input stage. When the operational amplifier 7 is switched to the third input stage, whose non-inverting input 21 is connected to ground and whose inverting input 22 is connected to the output 12, no amplitude-modulated useful signal is transmitted from the input 2 to the operational amplifier 7. In this case of operation, the gain is zero.

The function of time in accordance with which the three input stages of the operational amplifier 7 of FIG. 5 can be alternately switched actively so as to obtain a gain variation by which the influences of the third harmonic of the carrier oscillation and sensitivities of the circuit arrangement to signal frequencies can be suppressed in this range, is shown in FIG. 6f. The variation of the gain V with time t has the value 0 in the first twelfth part of the period T of the carrier oscillation, then jumps to the value 1 and drops to 0 again in the range of $\frac{1}{12}$ of the period T before and after half the duration of the period T. Subsequently, there is a switch-over to the value −1 up to an instant located $\frac{1}{12}$ of the period T before the end of the period of the carrier oscillation. For the rest of the period the gain V resumes the value 0. In FIG. 6g the associated actively switched input stage is shown for the respective value of the gain V.

An example for a switching signal generating stage 4 with which the time variation of the gain V shown in FIG. 6f can be generated is also shown in FIG. 5. This switching signal generating stage 4 comprises a network of three D-flipflops 23, 24, 25 representing a frequency divider for dividing the frequency of the control oscillation at the input 5 by the factor 6. The network 23, 24, 25 is connected to a logic circuit 26 which is to ensure correct functioning of the frequency divider circuit. The network 23, 24, 25 with the logic circuit 26 is described in detail in German Patent Application P 42 14 612.7, FIG. 7 and its description. This patent application is herein incorporated by reference. Each of the D-flipflops 23, 24, 25 has a (non-inverting) output Q1, Q2 and Q3 and—in addition to the arrangement in accordance with P 42 14 612.7—an inverting output 27, 28 and 29. All outputs Q1, Q2, Q3, 27, 28 and 29 of the D-flipflops 23, 24 and 25 of the network are connected to the associated inputs of the first combining circuit 30 in which, by logic combination of the signals supplied from the outputs of the D-flipflops 31, 32 and 33, the switching signals are formed on the switching signal lead 6 which is also connected to the first combining circuit 30. To explain the operation of the network 23, 24, 25 and the first combining circuit 30, FIGS. 6a to 6e show the signal variations at the frequency divider circuit described in detail in FIG. 8 of German Patent Application P 42 14 612.7. The clock signal CL according to FIG. 6a in the present invention provides the control oscillation whose frequency in this embodiment corresponds to six times the frequency of the carrier oscillation. The signals shown in FIGS. 6c to 6e occur at the non-inverting outputs Q1, Q2 and Q3 of the D-flipflops 23, 24 and 25, which signals constitute a square-wave oscillation divided in frequency by the factor 6 as compared with the control oscillation CL, while the square-wave oscillations at the individual outputs Q1, Q2 and Q3 are phase-shifted with respect to each other by one sixth of their period. FIG. 6b also shows the signal at the input D of the first D-FlipFlop 23 which, in accordance with the embodiments described in P 42 14 612.7 is supplied by the logic circuit 26. For each twelfth interval of the period T of the carrier oscillation an unambiguous logic combination of the control oscillation CL and the signals at the outputs Q1, Q2 and Q3 and their inverse values can be realised, so that the switching signals actively switching the individual input stages can be composed from the corresponding combinations for the individual parts of the period T. The logic combinations required for this purpose directly result from the values of the signals shown in FIGS. 6a and 6c to 6e and the switching states of the input stages in accordance with FIG. 6g.

Figure 7:
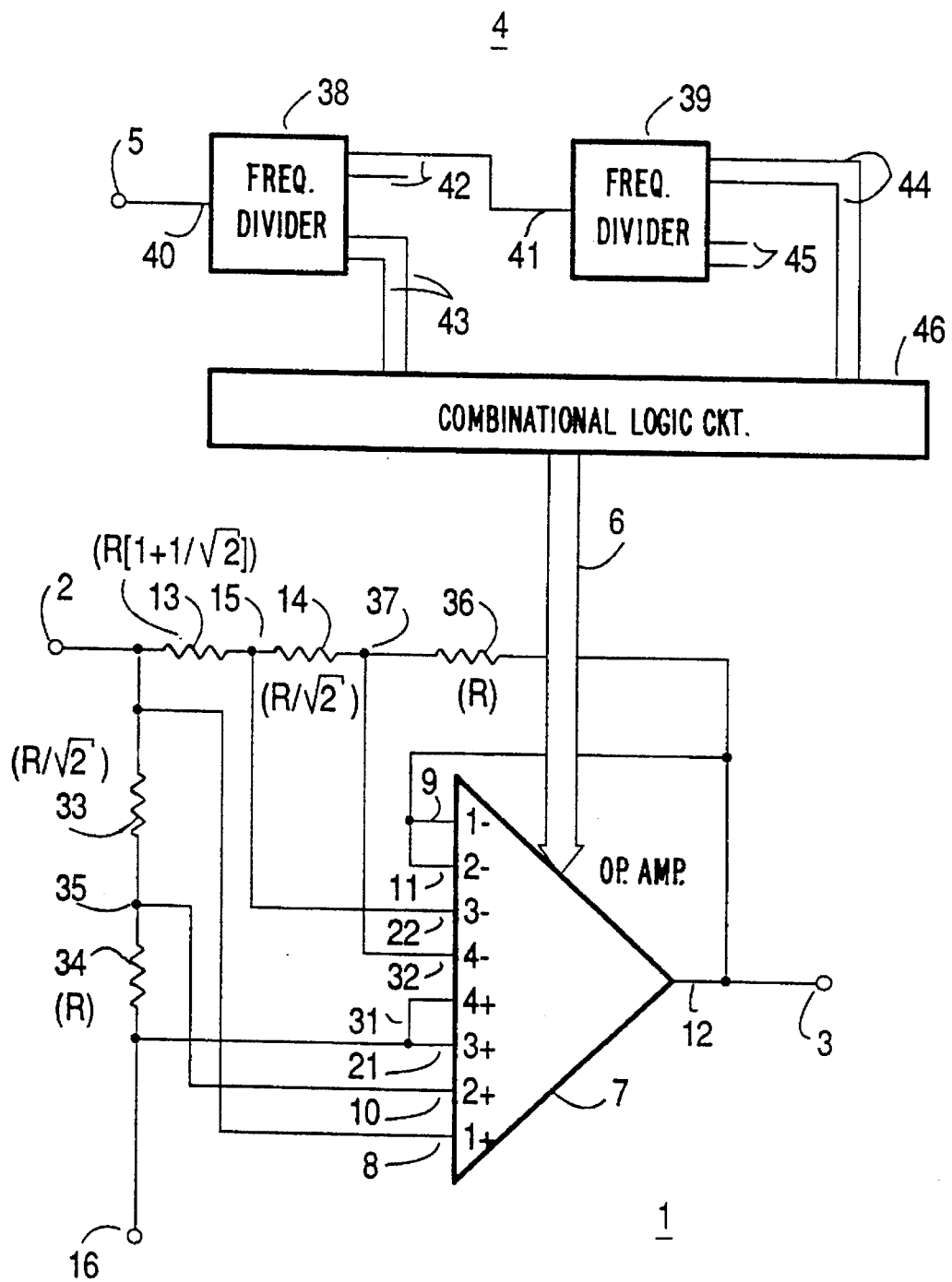

The embodiment shown in FIG. 7, in which elements already described have the same reference numerals, comprises an operational amplifier 7 having four input stages, the non-inverting input 31 of the fourth input stage being denoted by "4+" and the inverting input 32 being denoted by "4−" in conformity with the designations for the other input stages. Moreover, in this embodiment the amplifier arrangement 1 is provided with a first resistive voltage divider which comprises two resistors 33, 34 which are series arranged between the input 2 for the amplitude-modulated useful signal and the reference voltage terminal 16. A tap 35 which is connected to the non-inverting input 10 of the second input stage is arranged between the resistors 33, 34. The end terminals of the first resistive voltage divider 33, 34 may also be used as taps, but since they are connected to the input 2 and the reference voltage terminal 16, no new terms will be introduced for these terminals. In the embodiment of FIG. 7 the input 2 is connected to the non-inverting input 8 of the first input stage and the reference voltage terminal 16 is connected to the non-inverting inputs 21 and 31 of the third and the fourth input stage.

In the embodiment of FIG. 7 the second resistive voltage divider not only comprises the resistors 13, 14 with the tap 15 arranged in between, but also a further resistor 36 which is series arranged with the resistor 14. A second tap 37 of the second resistive voltage divider is arranged between these two resistors. The second resistive voltage divider thus extended is arranged in the manner described between the input 2 and the output 3 of the amplifier arrangement 1. The (first) tap 15 of the second resistive voltage divider is connected to the inverting input 22 of the third input stage, the second tap 37 is connected to the inverting input 32 of the fourth input stage. The inverting inputs 9, 11 of the first and the second input stage are jointly connected to the output 3 of the amplifier arrangement 1 (and to the output 12 of the operational amplifier 7, respectively).

In the embodiment of FIG. 7 the resistances of the resistors 13, 14, 33, 34, 36 of the two resistive voltage dividers are selectable in accordance with the gains desired at the active operation of the individual input stages of the operational amplifier 7. A time variation of the gain V with respect to time t can be particularly achieved thereby, as is diagrammatically shown in FIG. 8h. By means of the function of time which is shown in this Figure and which is a carrier frequency, step-shaped and zero-symmetrical function, it can be achieved that interference frequencies or sensitivities are not only suppressed in the range of the third harmonic of the carrier oscillation frequency but also in the range of its fifth harmonic. To this end the gain V assumes a value in the first eighth part of the period T of the carrier oscillation, which value corresponds to the square root of the number 2 reduced by 1. For the next quarter period of the carrier oscillation the gain V becomes 1, subsequently assumes the first-mentioned value for a further eighth part of the period T, jumps to the negative side of the aforementioned value for a further eighth pan of the period T, i.e. to 1 subtracted by the square root of the number 2 and assumes the value −1 for a further quarter period. During the last eighth part of the period T the gain V is 1 again reduced by the square root of the number 2. FIG. 8g shows the input stages 1 to 4 of the operational amplifier 7 active for the individual values of the gain V in accordance with FIG. 7.

To attain the afore-described values for the gain V in the case of active individual input stages, the resistances of the resistors of the resistive voltage divider are to be selected accordingly. For example, if the resistance of the resistor 34 of the first resistive voltage divider is denoted by the symbol R, the value of the other resistor 33 of the first resistive voltage divider is the value multiplied by the square root of the number 2 of this value R in this embodiment. The resistor 36 also acquires the value R, the resistor 13 acquires the value R multiplied by the reciprocal value raised by 1 of the square root of the number 2, whereas the value of the resistor 14 is fixed at R divided by the square root of the number 2.

In the amplifier arrangement t shown in FIG. 7 the taps of the first resistive voltage divider 33, 34 are connected to the non-inverting inputs 8, 10, 21, 31, while the taps of the second resistive voltage divider 13, 14, 36 are connected to the inverting inputs 9, 11, 22, 32. Similarly as in the embodiment shown in FIG. 5, embodiments are feasible in which this strict arrangement may be different.

The switching signal generating stage 4 in accordance with the embodiment shown in FIG. 7 has a second frequency divider which comprises two cascaded divider stages 38, 39. Each of the divider stages 38 and 39 has an input 40 and 41, respectively, which may receive a signal to be divided in its frequency by the factor 2, preferably a square-wave oscillation. Each divider stage 38, 39 has two outputs 42, 43 and 44, 45, respectively, from which a signal frequency of half the frequency of the signal applied to the associated input 40, 41 is derived. As compared with the signal at the second output 43, 45, the signal at the first output 42, 44 of the divider stage 38, 39 is shifted by one fourth of its period and by half the period of the signal at the associated input 40, 41, respectively. The signals at the first outputs 42, 44 are always switched in the divider stages 38, 39 at a rising edge of the signals applied to the inputs 40, 41, whereas the signals at the second outputs 43, 45 of the divider stages 38, 39 are always switched by a falling edge of the signals applied to the inputs 40, 41. Accordingly, the first outputs 42, 44 are also referred to as 0° outputs and the second outputs 43, 45 are also referred to as 90° outputs. All outputs 42 to 45 are two-pole push-pull outputs, whereas the inputs 40, 41 in the embodiment of FIG. 7 are only one-pole inputs but in a modification may be formed as two-poles.

An example for signal variations at the divider stages 38, 39 is shown in FIGS. 8a to 8f. The input 5 of the switching signal generating stage 4 connected to the input 40 of the first divider stage 38 receives a square-wave control oscillation which in accordance with FIG. 8a has four times the frequency of the carrier oscillation. The signal shown in FIG. 8f is then obtained at the non-inverting output terminal of the first output 42 of the first divider stage 38 which is connected to the input 41 of the second divider stage 39, whereas the signals shown in FIGS. 8b and 8c are obtained at the terminals of the second output 43. The signal shown in FIG. 8b is associated with the non-inverting output terminal and the signal shown in FIG. 8c is associated with the inverting output terminal of the second output 43 of the first divider stage 38.

Accordingly, the signal at the input 41 of the second divider stage 39 is divided in the second divider stage 39, which signal has the double frequency of the carrier oscillation and whose rising edge is in phase with the rising edges of the control oscillation. The signals shown in FIGS. 8d and 8e are obtained at the first output 44, while the signal shown in FIG. 8d is associated with the non-inverting output terminal and the signal shown in FIG. 8e is associated with the inverting output terminal of the first output 44 of the second divider stage 39. The rising edges of the signals at the non-inverting output terminals of the first outputs 42 and 44 are in phase with the rising edges of the control oscillation at input 40.

The terminals of the outputs 43 and 44 of the divider stages 38, 39 are connected to associated inputs of a second combining circuit 46 which is further connected to the switching signal lead 6 of the operational amplifier 7. In the second combining circuit 46 a number of switching signals for the input stages of the operational amplifier 7 is generated from the signals at the outputs 43, 44, i.e. from selected output signals of the divider stages 38, 39. The individual, appropriate logic combinations are obtained directly from the signal values of the signal variations shown in FIGS. 8b to 8e as compared with the signal variation shown in FIG. 8g.

Figure 9:
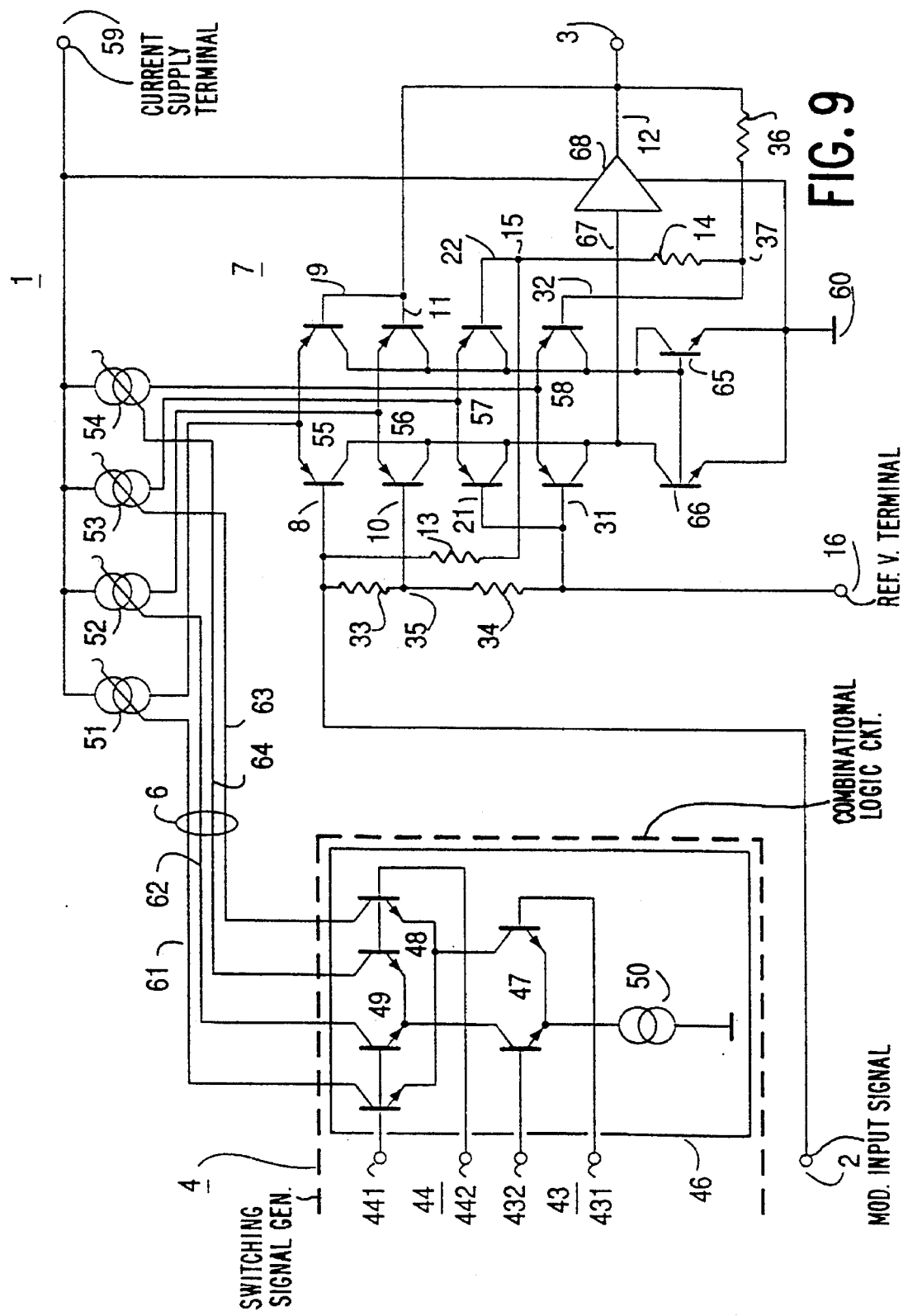
FIG. 9 is a detailed circuit diagram of a part of the circuit arrangement of FIG. 7.

A more detailed embodiment for the second combining circuit 46 and the operational amplifier 7 according to FIG. 7 is shown in FIG. 9. Elements already described have identical reference numerals again. The second combining circuit 46 comprising the switching signal generating stage 4 has four inputs which are denoted by the reference numerals 43 and 44 of the outputs of the divider stages 38 and 39 not shown in FIG. 9. The non-inverting output terminal of the second output 43 of the first divider stage 38 is denoted by the reference numeral 431; accordingly, 432 is the inverting output terminal of the second output 43, 441 is the non-inverting output terminal and 442 is the inverting output terminal of the first output 44 of the second divider stage 39. The signal according to FIG. 8b is applied to the output terminal 431, the signal according to FIG. 8c is applied to output terminal 432, the signal according to FIG. 8d is applied to output terminal 441 and the signal according to FIG. 8e is applied to output terminal 442.

The second combining circuit 46 has three emitter-coupled transistor pairs, the first transistor pair 47 of which is connected to ground by means of its interconnected emitter terminals via a current source 50 and by means of its collector terminals to one of the connections of the emitter terminals of the two other emitter-coupled transistor pairs 48 and 49. The base terminals of the transistors of the first emitter-coupled transistor pair 47 are connected as inputs of the second combining circuit 46 to the output terminals of the second output 43 of the first divider stage 38. A base terminal of the second and third emitter-coupled transistors pairs 48, 49 is connected to one of the output terminals 441 and 442, respectively of the first output 44 of the second divider stage 39. The collector terminals of the transistors of the second and third transistor pairs 48, 49 constitute first to fourth wires 61 to 64 of the switching signal lead 6. By controlling the emitter-coupled transistor pairs 47, 48, 49 with the signals in accordance with FIGS. 8b to 8e it is achieved that a current supplied by the current source 50 always flows through only one of the wires 61 to 64 of the switching signal lead 6.

The wires 61 to 64 of the switching signal lead 6 are connected to current sources 51 to 54. The current sources 51 to 54 are switchable by the currents through the wires 61 to 64 in such a way that the relevant current sources 51 to 54 convey a current when a current flows through the wires 61 to 64 connected thereto and that, conversely, the associated current sources 51 to 54 are blocked when no current flows through the associated wires 61 to 64.

Each of the current sources 51 to 54 is connected to input stages 55 to 58 formed as emitter-coupled transistor pair, viz. by means of one of its terminals with the connection of the emitter terminals of the associated input stage. The second terminals of each current source 51 to 54 are connected to a power supply terminal 59. Thus, only one of the input stages 55 to 58 is currently fed with a current via the switching signal lead 6, which current is derived from the associated current source 51 to 54, while the other input stages are currentless and thus inactive. While the base terminals of the emitter-coupled transistors constituting the first to fourth input stages 55 to 58 constitute the associated inputs 8 to 11, 21, 22, 31, 32, the collector terminals of all transistors associated with the inverting inputs 9, 11, 22 and 32 are connected to the connected base and collector terminals of a first current mirror transistor 65 and the collector terminals of all transistors of the input stages 55, 56, 57, 58 associated with the non-inverting inputs 8, 10, 21, 31 are connected to the collector terminal of a second current mirror transistor. The base terminals of the two current mirror transistors 65, 66 are interconnected and their emitter terminals are jointly connected to ground 60. An input terminal 67 leads from the collector terminal of the second current mirror transistor 66 to a common output stage 68 which together with each of the input stages 55 to 58 is active for post-amplification of the signal supplied by that input stage 55 to 58 which is currently active. The output of the output stage 68 constitutes the output 12 of the operational amplifier 7 and for the purpose of energy supply it is connected to the current supply terminal 59 and to ground 60.

In the circuit arrangement according to FIG. 9 the current sources 51 to 54 may also be current mirror circuits so that the current generated by the current source 50 is optionally mirrored in one of the input stages 55 to 58.

FIG. 10 shows another embodiment of the circuit arrangement according to the invention in which the operational amplifier 7 is provided with only one input stage having a non-inverting input 8 and an inverting input 9. The different input, output and feedback networks are not activated by actively switching different input stages of the operational amplifier but by switches which optionally connect the inputs 8, 9 to different taps of a first and a second resistive voltage divider, which FIG. 10 shows as a very simple embodiment in which the first resistive voltage divider between the input 2 of the amplifier arrangement 1 and the reference voltage terminal 16 can be dispensed with. For the sake of simplicity the switches are shown symbolically as mechanical switches but they may be preferably formed as transistor switches, particularly MOS transistors. The total arrangement shown in FIG. 10 is then advantageously manufactured in the BIMOS technique.

In FIG. 10 the switching signal lead 6 is constituted by four operating connections to the four switches, a first switch 101 of which is arranged between the input 2 of the amplifier arrangement 1 and the non-inverting input 8 of the operational amplifier 7, a second switch 102 is arranged between the tap 15 of the (second) resistive voltage divider 13, 14 and the inverting input 9, a third switch 103 is arranged between the output 12 and the inverting input 9 and a fourth switch 104 is arranged between the reference voltage terminal 116 and the non-inverting input 8. Similarly as with the input stages in the embodiments described so far, the switches 101 to 104 in FIG. 10 are switchable by means of the control signal supplied to the switching signal generating stage 4 from the input 5. To this end FIG. 11 shows a Table of a first operating example for the circuit arrangement according to FIG. 10 in which the gain of the amplifier arrangement 1 can be optionally set at the value +1 or −1. This corresponds to the case of operation of the circuit arrangement of FIG. 2. In the Table shown in FIG. 11 the switching states of the switches 101 to 104 are shown for the two gains to be set, with a "1" symbolizing a switch which is switched on and a "0" symbolizing a switch which is switched off.

In comparison with FIG. 11, FIG. 12 shows an embodiment for the switching signal generating stage 4 having a simple inverter. The control signal supplied via the input 5 directly controls the first and the third switch 101, 103, whereas the second and the fourth switch 102, 104 are activated by the inverse value of the control oscillation.

FIG. 13 shows a Table of the switching states of the switches 101 to 104 for a case of operation corresponding to that shown in FIG. 5. As compared with the switching states known from FIG. 11, a further combination of switching states is included, by which the amplifier arrangement 1 is switched to zero gain. Thus, two different types of operation can be realised in a very simple manner by means of one and the same arrangement according to FIG. 10; of course, the switching signal generating stage 4 should have a corresponding structure. For dimensioning the resistors 13, 14 the same applies as for the circuit arrangements shown in FIGS. 2 and 5, viz. their resistances should correspond.

Figures 14, 15:
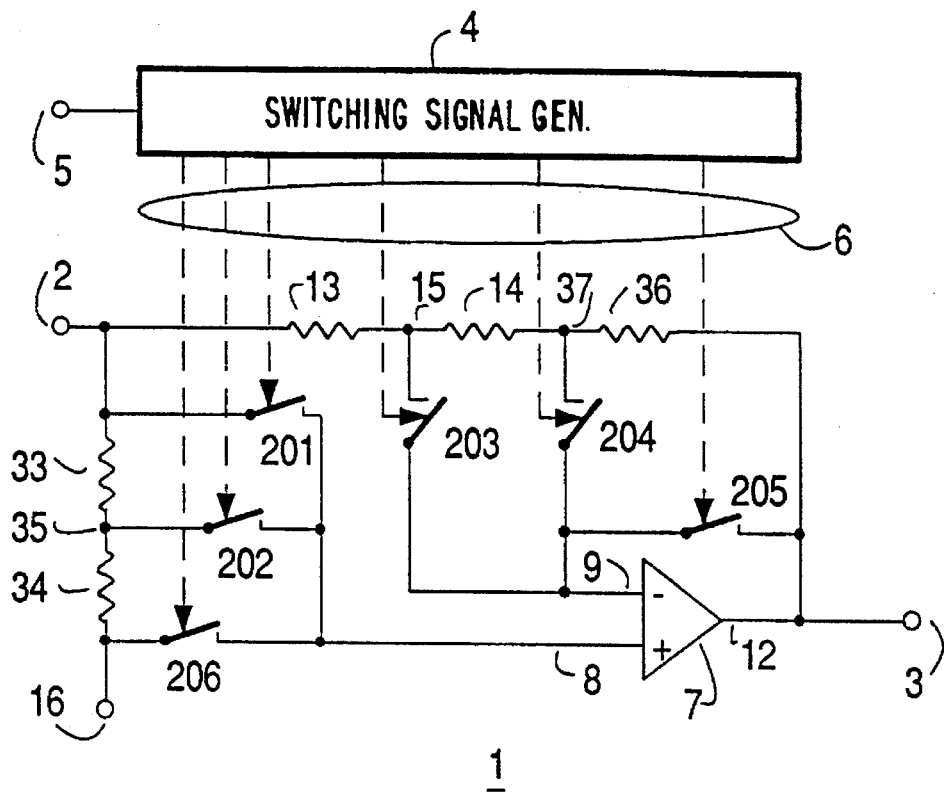
FIG. 14 shows a fifth embodiment of the circuit arrangement according to the invention, with an operational amplifier having an input stage and switchable input, output or feedback networks.
FIG. 15 shows a third Table to explain the mode of functioning of the circuit arrangement of FIG. 14.

FIG. 14 shows a further embodiment of the circuit arrangement according to the invention using the switch technique shown in FIG. 10 but implemented to switch to four values for the gain, i.e. for a mode of operation in accordance with the circuit arrangement shown in FIG. 7. Accordingly, the elements shown in this Figure are also provided with the same reference symbols in FIG. 14, which particularly applies to the two resistive voltage dividers consisting of the resistors 13, 14, 36 and 33, 34. Their dimensioning also corresponds to that shown in FIG. 7.

The arrangement shown in FIG. 14 has a total number of six switches by which the taps of the resistive voltage dividers 33, 34 and 13, 14, 36 can be optionally connected to the inputs 8, 9 of the operational amplifier 7. A first switch 201 connects the input 2 of the amplifier arrangement 1 to the non-inverting input 8 of the operational amplifier 7, a second switch 202 connects the tap 35 of the first resistive voltage divider 33, 34 to the input 8, a third switch 203 connects the tap 15 of the second resistive voltage divider 13, 14, 36 to the inverting input 9 which can be further connected via a fourth switch 204 to the tap 37 and via a fifth switch 205 to the output 12 of the operational amplifier 7. A sixth switch 206 optionally connects the reference voltage terminal 16 to the non-inverting input 8 of the operational amplifier 7. The switching signal lead 6 comprises six working connections in conformity with these six switches 201 to 206.

The individual switching states of the switches 201 to 206 for the four different gains which are to be fixed for operating the circuit arrangement of FIG. 14 in accordance with a gain variation V with respect to time t as shown in FIG. 8h are shown in FIG. 15 in the way as already explained with reference to FIGS. 11 to 13. With an implementation of the switching signal generating stage 4 by means of a frequency division in accordance with FIG. 7 and with the conditions for the positions of the switches in accordance with FIG. 15, a structure for an associated combining circuit can be directly determined.

Further operational processes, i.e. other functions of time t for the gain V may be realised with the circuit arrangement according to FIG. 14 by means of combinations, other than those shown in FIG. 15, of switch positions of the switches 201 to 206 and corresponding adapted implementations of the switching signal generating stage 4.

What is claimed is:

1. A circuit arrangement for demodulating an input signal in the form of a carrier wave which is amplitude modulated by an information signal, the demodulation recovering said information signal; said circuit arrangement comprising:

an operational amplifier having at least two alternate input networks which can be selectively activated, at least two alternate feedback networks which can be selectively activated, and an output terminal; the input signal being supplied in common to each of the input networks; said amplifier having a gain factor the value of which at any time is determined by which combination of said input networks and feedback networks are then activated; and switching means coupled to each of said input networks and to each of said feedback networks for periodically selectively activating different combinations of said input networks and feedback networks, thereby periodically varying the gain factor of said amplifier between different predetermined values; said periodic variation being at a frequency which is an integral multiple of the frequency of said carrier;

whereby the variation of the gain factor of said amplifier, as applied to said input signal, results in demodulation of said input signal and recovery of said information signal at the output of said amplifier.

2. A circuit arrangement as claimed in claim 1, wherein said switching means produces a periodic variation of the gain factor of said amplifier between said predetermined values in accordance with a periodic step-shaped symmetrical function of time, said function having a fundamental frequency component at a frequency corresponding to the frequency of said carrier wave.

3. A circuit arrangement as claimed in claim 2, wherein the time sequence and values of said periodic step-shaped function of time are such that said function also includes relatively small harmonics of said fundamental frequency component.

4. A circuit arrangement as claimed in claim 1, wherein the input signal is received at an input terminal of said circuit arrangement and each of said input networks comprises:

a differential amplifier having a pair of differential input terminals;

a first voltage divider connected between the input terminal of said circuit arrangement and a reference voltage terminal, said first voltage divider having taps respectively connected to a first of the differential input terminals of the differential amplifier of each of said input networks;

a second voltage divider connected between the input terminal of said circuit arrangement and the output of said operational amplifier, said second voltage divider having taps respectively connected to a second of the differential input terminals of the differential amplifier of each of said input networks;

said switching means periodically alternately activating the first and second differential input terminals of each of said differential amplifiers, thereby actuating those of the taps of said first and second voltage dividers which are connected to activated input terminals of said differential amplifiers.

5. The circuit arrangement as claimed in claim 4, wherein the first and second differential input terminals of each differential amplifier are respectively non-inverting and inverting inputs thereto.

6. A circuit arrangement as claimed in claim 1, wherein there are three alternate input networks which can be selectively activated, the gain factor of said operational amplifier is periodically switched between three different predetermined values, and said switching means comprises:

- a frequency divider for receiving a square wave clock signal having a frequency which is six times the frequency of said carrier wave, and dividing by six to derive from said clock signal three different square wave control signals at the frequency of said carrier wave and which are phase-shifted with respect to each other by one-six of the period of said carrier wave; and
- a combinational logic circuit for deriving a combination of said clock signal and the square wave control signals, said combination constituting a switching signal which periodically varies between three different values and which is supplied to the three input networks of said operational amplifier, each level of said switching signal activating a respective one of said input networks.

7. A circuit arrangement as claimed in claim 1, wherein there are four alternate input networks which can be selectively activated, the gain factor of said operational amplifier is periodically switched between four different predetermined values, and said switching means comprises:

- a first frequency divider for receiving a square wave clock signal having a frequency which is four times the frequency of said carrier wave, and dividing by two to derive first and second square wave output signals having double the frequency of said carrier wave and which are phase-shifted with respect to each other by one-fourth of the period of said doubled frequency; the first of said doubled frequency output signals constituting a first square wave control signal;
- a second frequency divider for receiving the second of said doubled frequency output signals of said first frequency divider, and dividing by two to derive third and fourth square wave output signals at the frequency of said carrier wave and which are phase-shifted with respect to each other by one-fourth of the period of said carrier wave; said third output signal constituting a second square wave control signal; and
- a combinational logic circuit for deriving a combination of said first and second square wave control signals, said combination constituting a switching signal which periodically varies between four different values and which is supplied to the input networks of said operational amplifier, each level of said switching signal actuating a respective one of said input networks.

* * * * *